United States Patent [19]
Law et al.

[11] Patent Number: 5,311,053
[45] Date of Patent: May 10, 1994

[54] INTERCONNECTION NETWORK

[75] Inventors: Hung-Fai S. Law, Los Altos; Henry T. Verheyen, San Jose, both of Calif.

[73] Assignee: Aptix Corporation, San Jose, Calif.

[21] Appl. No.: 66,601

[22] Filed: May 24, 1993

Related U.S. Application Data

[63] Continuation of Ser. No. 714,762, Jun. 12, 1991, abandoned.

[51] Int. Cl.$^5$ .............................................. H01L 27/02
[52] U.S. Cl. ...................................... 257/529; 257/530
[58] Field of Search .................. 357/51; 257/529, 530

[56] References Cited

U.S. PATENT DOCUMENTS

| | | | |
|---|---|---|---|
| 3,388,301 | 12/1968 | James | 257/707 |
| 4,441,167 | 4/1984 | Principi | 357/51 |
| 4,499,557 | 2/1985 | Holmberg et al. | 257/530 |
| 4,748,490 | 3/1988 | Hollingsworth | 257/530 |
| 4,899,285 | 2/1990 | Nakayama et al. | 364/453 |
| 4,974,048 | 11/1990 | Chakravorty et al. | 357/51 |

Primary Examiner—J. Carroll
Attorney, Agent, or Firm—D'Alessandro, Frazzini & Ritchie

[57] ABSTRACT

An interconnection element for use in an user-configurable interconnection technology includes a normally shorted fuse element and a normally open antifuse element connected in series. The antifuse element is designed to program at a first current at a selected programming voltage. The fuse element is designed to program at a second current which exceeds the first current by a margin sufficient to prevent inadvertent programming of fuse elements during the antifuse element programming cycle. An interconnection network for use in integrated circuits and other connection networks includes a plurality of circuit nodes which may be selectively connected to one another. Each circuit node is connected to other circuit nodes using the interconnection element of the present invention which includes an antifuse element which programs at a programming voltage and a first current in series with a fuse element which programs at a second current having a magnitude larger than the first current.

9 Claims, 3 Drawing Sheets

INTERCONNECTION NETWORK

CROSS-REFERENCE TO RELATED APPLICATION

This application is a file wrapper continuation of application Ser. No. 07/714,762 filed on Jun. 12, 1991, now abandoned.

BACKGROUND OF THE INVENTION

1. Field Of The Invention

The present invention relates to interconnect technology such as is used in integrated circuit technology and general interconnect substrate technology. More particularly, the present invention relates to user-configurable interconnections in integrated circuits and interconnection substrates and to a network of user-configurable interconnections for integrated circuits and interconnection substrates.

2. The Prior Art

Numerous schemes for providing integrated circuit interconnections are known in the prior art. Various ones of these schemes relate to user-configurable interconnections for use in integrated circuits, wherein a plurality of potential interconnection points are fabricated into an integrated circuit during the manufacturing process, but the particular interconnections between circuit nodes in the integrated circuit are made by the user by programming selected ones of the interconnections such that desired connections between circuit nodes are made while other potential interconnections are deliberately unrealized.

More recently, general interconnect schemes, which may be realized on non-integrated circuit substrates, such as thick-film and thin-film hybrids and printed circuit boards, have begun to be investigated. Interconnect matrix applications and other non-integrated circuit applications employing user-configurable interconnections between conductors are possible.

There are several types of user-configurable interconnect schemes which are currently available to the designer. One type of user-configurable interconnect is reprogrammable, and can be altered by a user after initial circuit configuration has been accomplished. In integrated circuits, this type of interconnect may be implemented by simple transistors whose gate voltages are controlled to determine the interconnections to be made, or by one form or another of non-volatile memory devices, such as EPROMS, EEPROMS, NOVRAMS, or combinations of both simple transistors and non-volatile memory elements. An example of a technology for implementing this type of interconnect is found in U.S. Pat. No. 4,870,302 to Freeman.

Another type of user-configurable interconnect element is one-time programmable, and once initially configured, may not be reconfigured. This type of user-configurable interconnect may take one of two forms, a first form, normally short circuited until rendered an open circuit as a result of a programming procedure, and a second form normally open circuited until rendered a short circuit as a result of a programming procedure.

The first form of one-time user-programmable interconnect is usually referred to as fuse technology, and is exemplified by the disclosure found in U.S. Pat. No. 4,796,075 to Whitten. The second form of one-time user-programmable interconnect is usually referred to as antifuse technology, and is exemplified by the disclosure found in U.S. Pat. No. 4,823,181 to Mohsen et al. and U.S. Pat. No. 4,899,205 to Hamdy et al.

While each form of one-time user-programmable interconnect technology has been and continues to be useful in numerous integrated circuit and general conductor interconnect applications, there remains room for improvement of this technology. For example, interconnect networks comprising fuse technology initially present a network of connected nodes. Fuses connecting unwanted circuit paths are then programmed by applying a voltage or current source across them. One disadvantage of this method is that other fuses in the interconnection network which are not to be programmed are in the current path of the fuse to be programmed. Depending on the configuration of the particular network, these "sneak" paths for current can be significant enough to require a large amount of current to be supplied to program the desired fuses.

When antifuse technology is used, care must be taken to avoid the inadvertent programming of antifuses which are intended to remain unprogrammed. In some cases, the existence of parallel current and voltage paths through the potential interconnection networks raises the possibility of stressing antifuses which are to remain unprogrammed. Overly stressed antifuses may inadvertently become programmed, or may become so weakened that they will present a reliability problem and shorten the operating lifetime of the circuit in which they are used. This consideration necessitates careful design of the programming process and may also affect circuit design considerations.

It is an object of the present invention to provide an interconnection network for use in integrated circuits and general electronic/conductor interconnection networks which minimizes or eliminates the disadvantages of fuse and antifuse based interconnection networks.

BRIEF DESCRIPTION OF THE INVENTION

According to a first aspect of the present invention, an interconnection element for use in an user-configurable interconnection technology wherein various selected conductors are to be electrically connected to one another includes a fuse element and an antifuse element connected in series. The antifuse elements are designed to program at a selected programming voltage. After the antifuse dielectric ruptures, a first current flows to lower the resistance of the antifuse. The fuse elements are designed to program at a second current which exceeds the first current by a margin sufficient to prevent inadvertent programming of fuse elements during the antifuse element programming cycle.

According to a second aspect of the present invention, an interconnection network for use in integrated circuits and other interconnection networks includes a plurality of circuit nodes which may be selectively connected to one another. Each circuit node is connected to other circuit nodes using the interconnect element of the present invention which includes an antifuse element which programs at a programming voltage and a first current in series with a fuse element which programs at a second current having a magnitude larger than the first current.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons and are intended to fall within the scope of the present invention which is limited only by the appended claims.

The first aspect of the present invention is an interconnection element useful for numerous types of user-configurable connection networks which may be encountered in integrated circuits and in other electrical interconnection networks in various environments such as thin-film and thick-film hybrids, and printed circuit boards, interconnection matrices fabricated on substrates such as glasses, metals, and ceramics. A presently preferred embodiment of an interconnection element according to the present invention is most easily understood with reference to FIG. 1a.

Figure 1A:
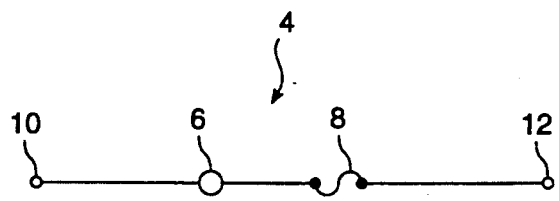
FIG. 1a is a schematic representation of an electrical interconnection element according to a presently preferred embodiment of the invention.

Referring now to FIG. 1a, an interconnection element 4 according to the present invention includes an antifuse 6 and a fuse element 8 connected in series between a first node 10 and a second node 12. Antifuse 6 may comprise any one of a wide variety of known antifuse structures, Examples of such structures which may be employed in the present invention include those disclosed in U.S. Pat. Nos. 4,823,181 and 4,899,205. Such structures are all characterized by including a pair of electrodes separated by a layer of insulating material. Antifuse 6 is an open circuit prior to programming and may be programmed by applying a voltage across the two electrodes having a sufficient magnitude to rupture the layer of insulating material to create a conductive low resistance current path between the two electrodes.

Fuse element 8 may also comprise one of the numerous known fuse structures known in the prior art. Examples of such structures are set forth in detail in U.S. Pat. No. 4,796,075. Such structures are all characterized by a conductive material disposed between two nodes. Fuse element 8 is a short circuit prior to programming and may be programmed by passing a current through the conductive material having a magnitude sufficient to vaporize the conductive material and create an open circuit.

Antifuse 6 and fuse element 8 are connected in series between a first node 10 and a second node 12. Connections between other circuit elements and the interconnection element 4 of the present invention are made through first and second nodes 10 and 12.

Figure 1B:
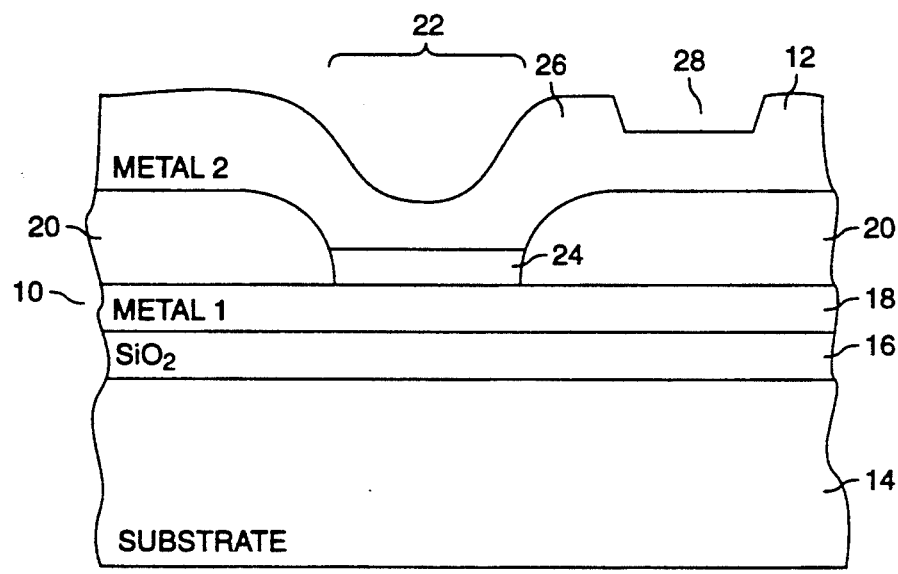
FIG. 1b is a cross sectional view of an electrical interconnection element according to the present invention.

Referring now to FIG. 1b, a cross sectional view of an interconnection element according to the present invention is shown. The interconnection element 4 is fabricated over a semiconductor or other substrate 14 over which an insulating layer 16, usually silicon dioxide or polyimide, is formed. The type of substrate employed will be determined by the application to which the interconnection element of the present invention is put. Non-exhaustive examples include user-programmable integrated circuits, user-programmable interconnection networks for use in numerous applications, such as connectors and switching matrices, printed circuit boards, and the like. Those of ordinary skill in the art will recognize that the need for dielectric layer 16 will depend on such factors as the conductivity of the substrate material, and/or the need to provide an adhesion-promoting layer for subsequent layers.

A first metal layer 18, formed from conventional materials,, forms first node 10 of the interconnection element 4 and the lower electrode of antifuse 6. An inter-metal dielectric layer 20 is formed over metal layer 18 and an antifuse window 22 is formed therein. A layer of an antifuse dielectric material 24 is formed in the antifuse window and a second metal layer 26,, comprising the upper electrode of antifuse 6, is formed over the antifuse dielectric 24 and the inter-metal dielectric layer 20. A reduced thickness portion 28 of second metal layer 26, formed by conventional techniques, comprises the fuse element 8. The right hand side of fuse element 8 forms the second node 12 of the interconnection element 4. This orientation is referred to as a "vertical orientation" in the claims.

Programming of interconnection element 4 is either a one-step or a two-step process, depending on whether it is desired to obtain a short circuit or an open circuit between first node 10 and second node 12. If it is desired to obtain a short circuit (i.e., a connection) between first node 10 and second node 12, the programming process is a one-step process comprising programming antifuse 6 by placing a voltage source across first and second nodes 10 and 12 which produces a voltage having sufficient magnitude to rupture the insulating layer between the two electrodes of the antifuse 6.

Care must be taken during the antifuse programming step to limit the current supplied by the voltage source to a value below that necessary to vaporize the conductive material in fuse element 8. This is generally not a problem since, in general, the mechanism which causes rupturing of the insulating material between the electrodes of antifuse 6 is a voltage-sensitive mechanism rather than a current-sensitive mechanism. Numerous known methods may be employed to achieve current limiting for a voltage supply used to program antifuse 6.

If it is desired to obtain an open circuit (i.e., no connection) between first node 10 and second node 12, the programming process is a two-step process comprising a first step of programming antifuse 6 by placing a voltage source across first and second nodes 10 and 12 which produces a voltage having sufficient magnitude to rupture the insulating layer between the two electrodes of the antifuse 6, followed by a second step of programming fuse element 8 by passing sufficient current through first and second nodes 10 and 12 to vaporize the conductive material in fuse element 8.

Figure 2:
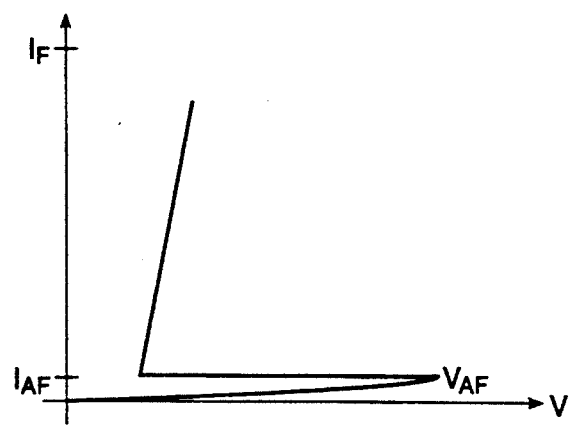
FIG. 2 is a graph illustrating the programming characteristics of the electrical interconnection element of the present invention.

FIG. 2 is a graph illustrating the programming characteristics of the interconnection element of the present invention. The horizontal axis represents the voltage across the interconnection element and the vertical axis represents the current through the interconnection element. It can be seen from FIG. 2 that the voltage is allowed to increase until it reaches a value of $V_{AF}$, the programming voltage for the antifuse 6. The current through the interconnection element gradually increases until the antifuse dielectric is ruptured, after which the voltage decreases due to the low resistance across the device and the current $I_{AF}$, the current needed to assure proper programming of the antifuse 6 flows. If the current is allowed to increase, it will increase to a value of $I_F$, the value required to program the fuse element 8. After the conductive material in fuse element 8 vaporizes, an open circuit is created and the voltage rises to the supply value with no current flow.

Those of ordinary skill n the art can appreciate that use of interconnection element 4 in an integrated circuit containing a plurality of interconnection elements overcomes the problems inherent in both antifuse and fuse element interconnection elements. First, since all antifuse elements on the integrated circuit are necessarily programmed, the problems usually encountered by overstressing antifuses to remain unprogrammed do not exist. Second, since all interconnection elements 4 according to the present invention are initially open circuits, the programming of the first interconnection element may be accomplished without large amounts of wasted current being drawn from the programming voltage source by parasitic current paths through other unprogrammed interconnection elements.

Figure 3:
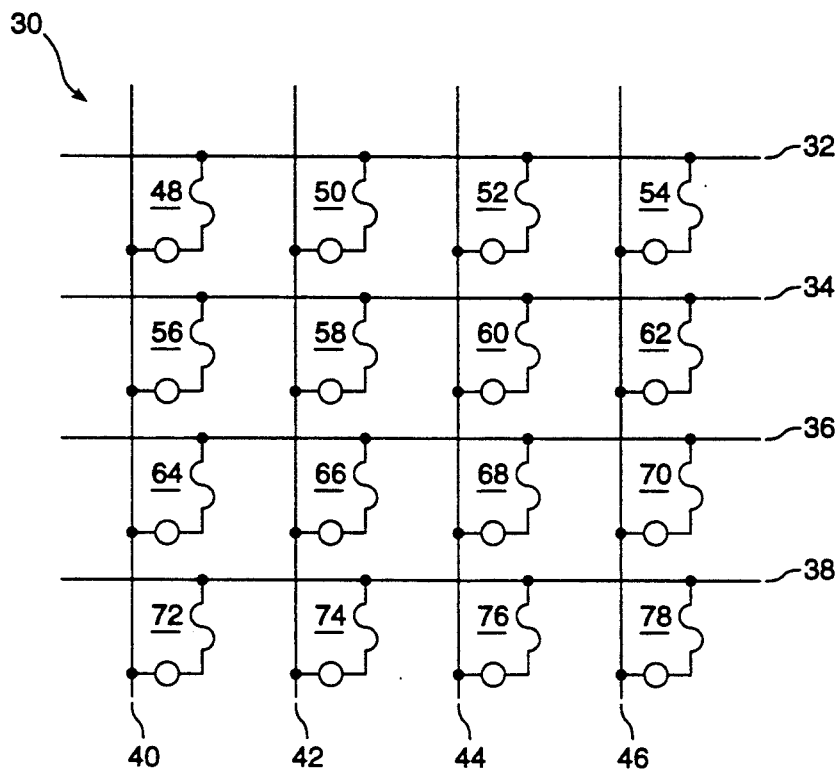
FIG. 3 is a schematic diagram of an electrical interconnection network including a plurality of interconnection elements according to a presently preferred embodiment of the invention.

Interconnection element 4 may be used in any number of applications and is particularly useful as an element of an interconnection network. Referring now to FIG. 3, an interconnection network according to a presently preferred embodiment of the invention is shown. Those of ordinary skill in the art will realize that the interconnection network may exist in the environment of an integrated circuit or other circuit or network as previously described.

The interconnection network of FIG. 3 comprises at least one first conductor intersecting at least one second conductor. Interconnection elements according to the present invention are placed between selected ones of or all of the intersecting conductors. In the context of the present invention, "intersecting" is not limited to physical crossings of the conductors, but also includes conceptual intersections, i.e., intersections occurring as a result of the desire to provide a potential connection between conductors manifested by locating an interconnection element between the two conductors.

An interconnection matrix 30 according to the present invention includes a plurality of first conductors 32, 34, 361, and 38, intersecting a plurality of second conductors 40, 42, 441, and 46. Sixteen intersections are formed and each intersection includes an interconnection element according to the present invention connected between the two conductors which form the intersection. Interconnection element 48 is connected between first conductor 32 and second conductor 40. Interconnection element 50 is connected between first conductor 32 and second conductor 42. Interconnection element 52 is connected between first conductor 32 and second conductor 44. Interconnection element 54 is connected between first conductor 32 and second conductor 46. Interconnection element 56 is connected between first conductor 34 and second conductor 40. Interconnection element 58 is connected between first conductor 34 and second conductor 42. Interconnection element 60 is connected between first conductor 34 and second conductor 44. Interconnection element 62 is connected between first conductor 34 and second conductor 46. Interconnection element 64 is connected between first conductor 36 and second conductor 40. Interconnection element 66 is connected between first conductor 36 and second conductor 42. Interconnection element 68 is connected between first conductor 36 and second conductor 44. Interconnection element 70 is connected between first conductor 36 and second conductor 46. Interconnection element 72 is connected between first conductor 38 and second conductor 40. Interconnection element 74 is connected between first conductor 38 and second conductor 42. Interconnection element 76 is connected between first conductor 38 and second conductor 44. Interconnection element 78 is connected between first conductor 38 and second conductor 46.

According to a presently preferred embodiment of the present invention, interconnection elements which are to remain open circuits are programmed first by programming both of their antifuse and fuse elements. After all of such interconnection elements have been programmed as open circuits, the antifuses in interconnection elements which are to be short circuits are programmed with a voltage source current-limited to a current value safely below that necessary to program the fuse elements by vaporizing them.

There are other advantages of the interconnection element of the present invention. The antifuses can be designed to program at a voltage close to the normal operating voltages to be encountered in the circuit or network interconnection being configured by the interconnection element because all of the antifuses in a finished circuit will be programmed, thus eliminating the need to avoid stressing unprogrammed antifuses during normal circuit operation to increase circuit operating life.

Figure 4:
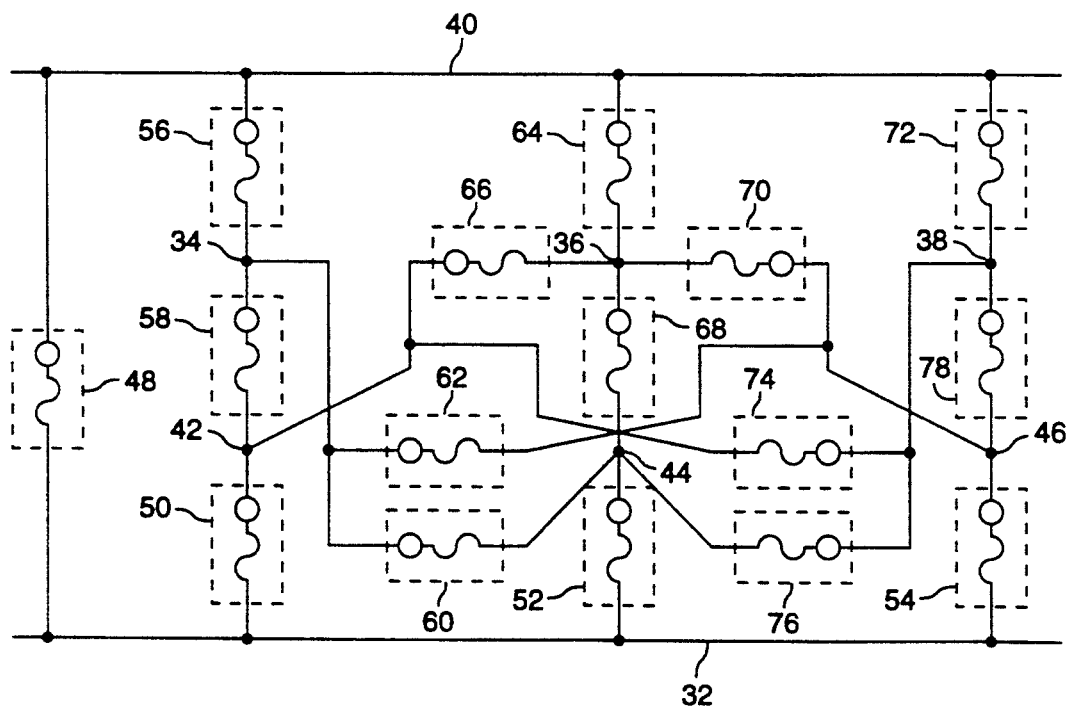
FIG. 4 is a schematic diagram illustrating an electrical circuit equivalent to the circuit of the circuit of FIG. 3 while programming a selected one of the interconnection elements.

As those of ordinary skill in the art will readily recognize, there are numerous uses for structures such as the one depicted in FIG. 3, including, but not limited to, crosspoint switches and programmable interconnection element for user-programmable integrated circuits. The difference between programming the interconnection matrix 30 of the present invention and prior art interconnection networks and devices may be readily seen by examination of FIG. 4, which is a schematic diagram of the circuit of FIG. 3, redrawn to illustrate the equivalent circuit presented during the programming of the interconnection element 48. First conductor 32 is shown at the bottom of FIG. 4 and second conductor 40 is shown at the top of FIG. 4. Interconnection element 48 is shown connected between first conductor 32 and second conductor 40. The other first and second conductors 34, 36, 38, 42, 44, and 46 and interconnection elements 50, 52, 54, 56, 58, 60, 62, 64, 66, 68, 70, 72, 74, 76, and 78 are also shown.

If it is assumed that no interconnection elements have yet been programmed, it may be seen from FIG. 4 that, when a programming voltage is placed across first conductor 32 and second conductor 40, the only antifuse which that voltage appears across is the antifuse associated with interconnection element 48. Similarly, because the antifuses associated with the other interconnection elements remain unprogrammed, there exist no parasitic current paths to draw additional current from the programming voltage source.

As additional interconnection elements are programmed, a number of parasitic current paths will be created. However, as will be appreciated by those of ordinary skill in the art, the total number of connections which are to be made by programming both the antifuse and the fuse element in a particular interconnection element in a typical application is relatively small, and the parasitic current will thus not grow to a large value which interferes with the programming scheme.

In addition, programming voltages can be applied to more than two conductors simultaneously. For example, antifuses and fuse elements in interconnection elements 48, 52, and 54 may be simultaneously programmed by applying the antifuse programming voltage across first conductor 32 and second conductors 40, 44, and 46. The only limiting factor in this example is that the current carrying capacity of first conductor 32 be greater than three times the fuse programming current of the fuse elements in interconnection elements 48, 52, and 54.

According to another aspect of the present invention, one or more of the first and/or second conductors 32, 34, 36, 38, 40, 42, 44, and 46 may be divided into two or more contiguous segments. The segments may be connected together by programmable elements. In one embodiment of the invention, the programmable elements may be interconnection elements such as those shown in FIG. 1a. In other embodiments of the invention, the programmable elements may be either normally-open antifuse elements like element 6 or normally-shorted fuse elements like element 8. By segmenting the conductors, parasitic loading is reduced and track utilization is better optimized.

Figure 5:
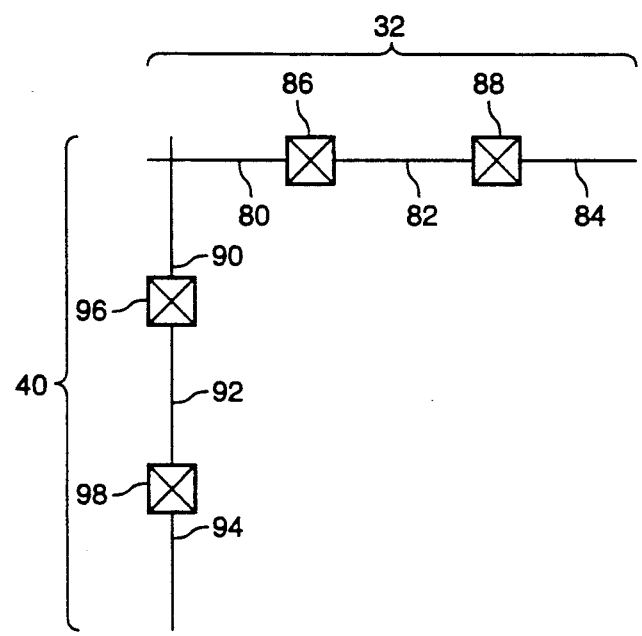
FIG. 5 is a schematic diagram illustrating an aspect of the present invention including two intersecting segmented conductors connectable together by interconnection elements.

Such an embodiment of the present invention is illustrated in FIG. 5. FIG. 5 shows representative first conductor 32 intersecting representative second conductor 40 from the matrix illustrated in FIG. 3. Interconnection element 48 has been omitted to more easily show the segmenting feature of the present invention.

As can be seen from FIG. 5, first conductor 32 has been divided into three segments 80, 82, and 84. A programmable element shown at reference numeral 86 connects segment 80 to segment 82 and programmable element 88 connects segment 82 to segment 84. Likewise, second conductor 40 has been divided into three segments 90, 92, and 94. Programmable element 96 connects segment 90 to segment 92 and programmable element 98 connects segment 92 to segment 94. Those of ordinary skill in the art will recognize that the embodiment disclosed in FIG. 5 is merely illustrative, and that the number of segments into which the conductors are to be divided, and the length of each individual segment are matters of design choice based upon considerations pertinent to a particular design.

In one embodiment of this aspect of the invention, programmable elements 86, 88, 96, and 98 may be the interconnection elements shown in FIG. 1a. In other embodiments of the invention, programmable elements 86, 88, 96, and 98 may be either normally-open antifuse elements like element 6, normally-shorted fuse elements like element 8, or combinations of all three. Prudent and ordinary design procedure should be employed to ensure that programming paths and voltages and currents are such as to prevent inadvertent programming of programmable elements which are to remain unprogrammed.

Those of ordinary skill in the art will recognize that the embodiments shown and described herein are illustrative only and that the scope of the invention is not to be limited to the particular embodiments shown and described in the figures and accompanying written disclosure herein. Preferred embodiments of the present invention have been shown and described herein, but from this disclosure, those of ordinary skill in the art will readily be able to comprehend and conceive other embodiments which are variations from the above disclosed embodiments. Such embodiments are meant to fall within the scope of the present invention which is to be limited only by the appended claims.

What is claimed is:

1. An interconnection element for use in a user-configurable interconnection technology comprising:
   a normally shorted fuse element; and
   a normally open antifuse element;
   wherein said fuse element and said antifuse element are connected in series and formed over a non-conductive material in a vertical orientation, said antifuse element is programmable to a shorted state at a selected programming voltage at a first current, said fuse element is programmable to an open state at a second current, and said second current has a magnitude larger than the magnitude of said first current.

2. A user-programmable interconnect element comprising:
   a lower metal electrode disposed on an insulating substrate material;
   a layer of insulating material disposed over said lower metal electrode, said insulating material including an aperture therethrough communicating with said lower metal electrode;
   a layer of antifuse material disposed in said aperture over said lower metal electrode;
   an upper metal electrode disposed over said layer of insulating material, a first portion of said upper metal electrode disposed in said aperture over said layer of antifuse material and having a first thickness, and a second portion of said upper metal electrode comprising a region having a second thickness less than said first thickness to form a fuse element.

3. An interconnection matrix integrable on a single piece of substrate material comprising:
   a non-conductive layer on the substrate material;
   a plurality of first interconnection conductors generally oriented in a first direction disposed on said non-conductive layer;
   a plurality of second interconnection conductors generally oriented in a second direction disposed over said non-conductive layer, ones of said second interconnection conductors forming intersections with ones of said first interconnection conductors;
   a plurality of user-programmable interconnection elements, ones of said interconnection elements connected between selected ones of said first interconnection conductors and selected ones of said second interconnection conductors, said user-programmable interconnection elements comprising a normally shorted fuse element connected in series with a normally open antifuse element wherein said fuse element and said antifuse element are formed over said non-conductive layer in a vertical orientation, said antifuse element is programmable to a shorted state at a selected programming voltage at a first current, said fuse element is programmable to an open state at a second current, and said second current has a magnitude larger than the magnitude of said first current.

4. The interconnection matrix of claim 3, wherein at least one of said first interconnection conductors is divided into at least two adjacent first segments, and further including a programmable element connected between at least two adjacent ones of said at least two adjacent first segments.

5. The interconnection matrix of claim 4, wherein said user-programmable interconnection element is a normally-shorted fuse element.

6. The matrix of claim 4, wherein said user-programmable interconnection element is a normally-open antifuse element.

7. The interconnection matrix of claim 4, wherein at least one of said second conductors is divided into at least two adjacent second segments, and further including a user-programmable interconnection element connected between at least two adjacent ones of said at least two second segments.

8. An interconnection matrix integrable on a single piece of substrate material comprising:
a non-conductive layer on the substrate material;
a plurality of first interconnection conductors generally oriented in a first direction disposed on said non-conductive layer, at least one of said first conductors divided into at least two adjacent first segments;
a plurality of second interconnection conductors generally oriented in a second direction disposed over said non-conductive layer;
a plurality of user-programmable interconnection elements, first ones of said interconnection elements connected between selected ones of said first conductors and selected ones of said second conductors and second ones of said user-programmable interconnection elements connected between adjacent ones of said at least two first segments, said user-programmable interconnection elements comprising a normally shorted fuse element connected in series with a normally open antifuse element wherein said fuse element and said antifuse element are formed over said non-conductive layer in a vertical orientation, said antifuse element is programmable to a shorted state at a selected programming voltage at a first current, said fuse element is programmable to an open state at a second current, and said second current has a magnitude larger than the magnitude of said first current.

9. The interconnection matrix of claim 4, wherein at least one of said second conductors is divided into at least two adjacent second segments, and further including one of said user-programmable interconnection elements connected between at least two adjacent ones of said at least two second segments.

* * * * *